United States Patent
Lee et al.

(10) Patent No.: US 9,859,488 B2
(45) Date of Patent: *Jan. 2, 2018

(54) MAGNETIC MEMORY DEVICE AND METHOD OF MANUFACTURING THE SAME

(71) Applicant: Samsung Electronics Co., Ltd., Suwon-si, Gyeonggi-do (KR)

(72) Inventors: Joonmyoung Lee, Anyang-si (KR); Kwangseok Kim, Seoul (KR); Ki Woong Kim, Hwaseong-si (KR); Whankyun Kim, Seoul (KR); Sang Hwan Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/466,802

(22) Filed: Mar. 22, 2017

(65) Prior Publication Data

US 2017/0194555 A1 Jul. 6, 2017

Related U.S. Application Data

(63) Continuation of application No. 14/794,801, filed on Jul. 8, 2015, now Pat. No. 9,640,755.

(30) Foreign Application Priority Data

Nov. 10, 2014 (KR) ........................ 10-2014-0155552

(51) Int. Cl.
*H01L 43/02* (2006.01)
*H01L 43/08* (2006.01)
(Continued)

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01); *G11C 11/161* (2013.01)

(58) Field of Classification Search
CPC ....... G11C 11/161; H01L 43/02; H01L 43/08; H01L 43/12
(Continued)

(56) References Cited

U.S. PATENT DOCUMENTS 7,679,133 B2 3/2010 Son et al.
7,920,361 B2 4/2011 Yoshikawa et al.
(Continued)

OTHER PUBLICATIONS

Kolmogorov, Aleksey N. et al., "Theoretical study of metal borides stability," Physical Review B 74, 224507 (2006), 2006 The American Physical Society, pp. 224507-1-224507-14.

*Primary Examiner* — Fernando L Toledo
*Assistant Examiner* — Adam S Bowen
(74) *Attorney, Agent, or Firm* — Renaissance IP Law Group LLP

(57) ABSTRACT

A magnetic memory device includes a reference magnetic pattern having a magnetization direction fixed in one direction, a free magnetic pattern having a changeable magnetization direction, and a tunnel barrier pattern disposed between the free and reference magnetic patterns. The free magnetic pattern has a first surface being in contact with the tunnel barrier pattern and a second surface opposite to the first surface. The magnetic memory device further includes a sub-oxide pattern disposed on the second surface of the free magnetic pattern, and a metal boride pattern disposed between the sub-oxide pattern and the second surface of the free magnetic pattern. The magnetization directions of the free and reference magnetic patterns are substantially perpendicular to the first surface of the free magnetic pattern.

20 Claims, 12 Drawing Sheets

(51) Int. Cl.
   *H01L 43/12*     (2006.01)
   *H01L 27/22*     (2006.01)
   *H01L 43/10*     (2006.01)
   *G11C 11/16*     (2006.01)

(58) Field of Classification Search
   USPC ........................................................ 257/421
   See application file for complete search history.

(56) References Cited

U.S. PATENT DOCUMENTS

| | | |
|---|---|---|
| 8,530,887 B2 | 9/2013 | Kitagawa et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,878,318 B2 | 11/2014 | Chen et al. |
| 2003/0179071 A1 | 9/2003 | Hiramoto et al. |
| 2008/0291585 A1 | 11/2008 | Yoshikawa et al. |
| 2009/0121271 A1 | 5/2009 | Son et al. |
| 2011/0149647 A1 | 6/2011 | Kim et al. |
| 2011/0216603 A1 | 9/2011 | Han et al. |
| 2011/0227179 A1 | 9/2011 | Kitagawa et al. |
| 2011/0233648 A1 | 9/2011 | Seol et al. |
| 2012/0051143 A1 | 3/2012 | Yoon et al. |
| 2012/0205758 A1 | 8/2012 | Jan et al. |
| 2012/0235258 A1 | 9/2012 | Zhao et al. |
| 2012/0261777 A1 | 10/2012 | Shukh |
| 2012/0300542 A1 | 11/2012 | Uchida et al. |
| 2013/0028013 A1 | 1/2013 | Ikeda et al. |
| 2013/0042081 A1 | 2/2013 | Park et al. |
| 2013/0075839 A1 | 3/2013 | Chen et al. |
| 2013/0075845 A1 | 3/2013 | Chen et al. |
| 2013/0234266 A1 | 9/2013 | Prejbeanu et al. |
| 2013/0279262 A1 | 10/2013 | Yoon et al. |
| 2013/0307097 A1 | 11/2013 | Yi et al. |
| 2014/0011298 A1 | 1/2014 | Li |
| 2014/0038312 A1 | 2/2014 | Lee et al. |
| 2014/0077318 A1 | 3/2014 | Kula et al. |
| 2014/0104724 A1 | 4/2014 | Shiroishi et al. |
| 2015/0076485 A1 | 3/2015 | Sandhu et al. |
| 2015/0249206 A1 | 9/2015 | Kim et al. |

MAGNETIC MEMORY DEVICE AND METHOD OF MANUFACTURING THE SAME

CROSS-REFERENCE TO RELATED APPLICATION

This U.S. non-provisional patent application is a continuation of U.S. patent application Ser. No. 14/794,801, filed Jul. 8, 2015, which claims priority under 35 U.S.C. §119 to Korean Patent Application No. 10-2014-0155552, filed on Nov. 10, 2014, in the Korean Intellectual Property Office, the disclosure of which is hereby incorporated by reference in its entirety.

BACKGROUND

The inventive concepts relate to semiconductor devices and methods of manufacturing the same. More particularly, the inventive concepts relate to magnetic memory devices and methods of manufacturing the same.

High-speed and/or low-voltage semiconductor memory devices have been demanded to realize power consumption electronic devices. Magnetic memory devices have been developed to satisfy these demands. The magnetic memory devices have high-speed operational and/or non-volatile characteristics, so they are spotlighted as a next-generation semiconductor memory device.

SUMMARY

In an embodiment, a magnetic memory device may include a reference magnetic pattern having a magnetization direction fixed in one direction; a free magnetic pattern having a changeable magnetization direction, a tunnel barrier pattern disposed between the free magnetic pattern and the reference magnetic pattern, the free magnetic pattern having a first surface being in contact with the tunnel barrier pattern and a second surface opposite to the first surface, a sub-oxide pattern disposed on the second surface of the free magnetic pattern, and a metal boride pattern disposed between the sub-oxide pattern and the second surface of the free magnetic pattern. The magnetization directions of the free and reference magnetic patterns may be substantially perpendicular to the first surface of the free magnetic pattern.

The metal boride pattern may include a metal and boron, and the free magnetic pattern may include at least one magnetic element. A boride-formation energy of the metal of the metal boride pattern may be lower than a boride-formation energy of the at least one magnetic element of the free magnetic pattern.

A boron concentration of the metal boride pattern may be higher than a boron concentration of the free magnetic pattern.

At least a portion of the free magnetic pattern may be in a crystalline state, and a boron concentration of the crystalline portion of the free magnetic pattern may be lower than about 10 atomic percent (at %).

Oxygen atoms may be combined with the magnetic element of the free magnetic pattern at an interface between the metal boride pattern and the free magnetic pattern to induce interface perpendicular magnetic anisotropy (i-PMA).

The metal boride pattern may further include oxygen.

The sub-oxide pattern may include the same metal as the metal boride pattern.

A thickness of the metal boride pattern may be in a range of 0.5 Å to 10 Å.

The reference magnetic pattern, the tunnel barrier pattern, the free magnetic pattern, the metal boride pattern, and the sub-oxide pattern may be sequentially stacked on a substrate.

The sub-oxide pattern, the metal boride pattern, the free magnetic pattern, the tunnel barrier pattern, and the reference magnetic pattern may be sequentially stacked on a substrate.

In an embodiment, a method of manufacturing a magnetic memory device may include sequentially forming a reference magnetic layer, a tunnel barrier layer, and a free magnetic layer on a substrate, forming a metal boride layer on the free magnetic layer, and forming a sub-oxide layer on the metal boride layer. The reference magnetic layer may have a magnetization direction fixed in one direction, and the free magnetic layer may have a changeable magnetization direction. The magnetization directions of the reference magnetic layer and the free magnetic layer may be substantially perpendicular to a surface of the free magnetic layer that is in contact with the tunnel barrier layer.

The free magnetic layer may include at least one magnetic element and boron. Forming the metal boride layer and forming the sub-oxide layer may include forming a metal layer on the free magnetic layer, diffusing boron atoms of the free magnetic layer into a lower portion of the metal layer by an annealing process to form the metal boride layer, and supplying oxygen into a remaining upper portion of the metal layer by an oxidation process to form the sub-oxide layer.

Forming the metal boride layer and forming the sub-oxide layer may include: depositing the metal boride layer on the free magnetic layer by a deposition process and depositing the sub-oxide layer on the metal boride layer by a deposition process.

The method may further include after depositing the sub-oxide layer, performing a thermal treatment process to diffuse oxygen atoms included in the sub-oxide layer to an interface between the metal boride layer and the free magnetic layer.

The free magnetic layer may include at least one magnetic element, and a boride-formation energy of a metal of the metal layer may be lower than a boride-formation energy of the at least one magnetic element of the free magnetic layer.

A boron concentration of the metal boride layer may be higher than a boron concentration of the free magnetic layer.

In an embodiment, a method of manufacturing a magnetic memory device may include forming a sub-oxide layer on a substrate, forming a metal boride layer and a free magnetic layer that are sequentially stacked on the sub-oxide layer, forming a tunnel barrier layer on the free magnetic layer, and forming a reference magnetic layer on the tunnel barrier layer. The reference magnetic layer may have a magnetization direction fixed in one direction, and the free magnetic layer may have a changeable magnetization direction. The magnetization directions of the reference magnetic layer and the free magnetic layer may be substantially perpendicular to a surface of the free magnetic layer that is in contact with the tunnel barrier layer.

The free magnetic layer may include at least one magnetic element and boron. Forming the metal boride layer and the free magnetic layer may include forming a metal layer on the sub-oxide layer, forming the free magnetic layer on the metal layer, and diffusing boron atoms of the free magnetic layer into the metal layer by an annealing process to form the metal boride layer.

Forming the metal boride layer and the free magnetic layer may include depositing the metal boride layer on the sub-oxide layer by a deposition process, and forming the free magnetic layer on the deposited metal boride layer.

The method may further include after forming the free magnetic layer, performing a thermal treatment process to diffuse oxygen atoms included in the sub-oxide layer to an interface between the metal boride layer and the free magnetic layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
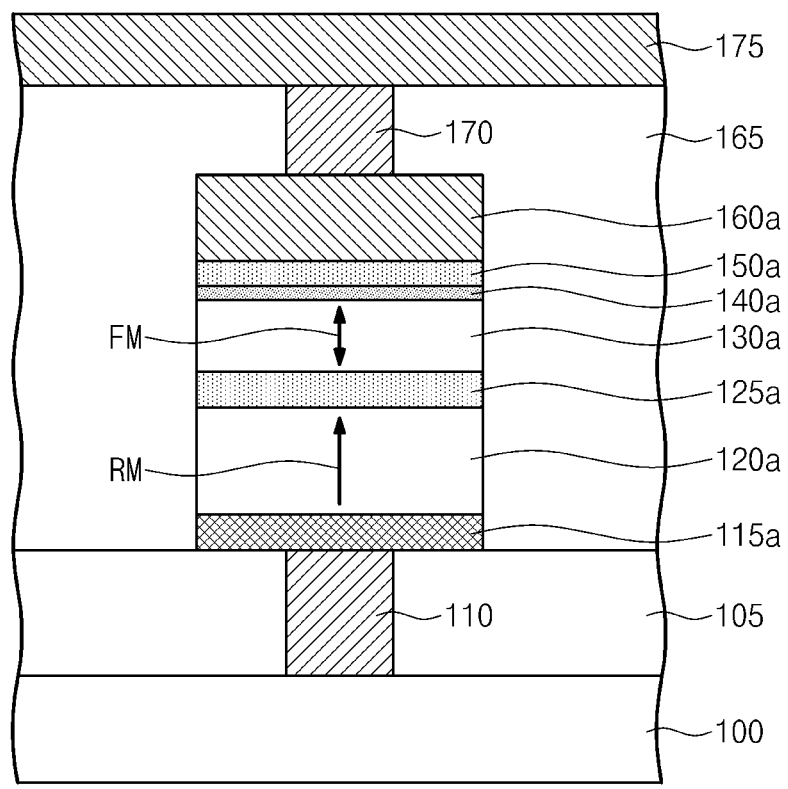
FIG. 1 is a cross-sectional view illustrating a magnetic memory device according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

A magnetic memory device may include a magnetic tunnel junction (MTJ) pattern. The MTJ pattern may include two magnetic bodies and an insulating layer interposed therebetween. A resistance value of the MTJ pattern may be changed according to magnetization directions of the two magnetic bodies. For example, if the magnetization directions of the two magnetic bodies are anti-parallel to each other, the MTJ pattern has a relativity high resistance value. If the magnetization directions of the two magnetic bodies are parallel to each other, the MTJ pattern has a relatively low resistance value. Data can be written and/or read into and/or from the MTJ pattern by means of a difference between the resistance values.

FIG. 1 is a cross-sectional view illustrating a magnetic memory device according to some embodiments of the inventive concepts.

Referring to FIG. 1, a magnetic memory device according to some embodiments of the inventive concepts may include a reference magnetic pattern 120a having a magnetization direction RM fixed in one direction, a free magnetic pattern 130a having a changeable magnetization direction FM, and a tunnel barrier pattern 125a disposed between the reference and free magnetic patterns 120a and 130. The free magnetic pattern 130a may include a first surface being in contact with the tunnel barrier pattern 125a and a second surface opposite to the first surface. The magnetic memory device further includes a sub-oxide pattern 150a disposed on the second surface of the free magnetic pattern 130a and a metal boride pattern 140a disposed between the sub-oxide pattern 150a and the second surface of the free magnetic pattern 130a.

The reference magnetic pattern 120a, the tunnel barrier pattern 125a, the free magnetic pattern 130a, the metal boride pattern 140a, and the sub-oxide pattern 150a may be sequentially stacked on a substrate 100, as illustrated in FIG. 1. In an embodiment, the first surface and the second surface of the free magnetic pattern 130a may correspond to a bottom surface and a top surface of the free magnetic pattern 130a, respectively.

A lower interlayer insulating layer 105 may be disposed on the substrate 100, and a lower contact plug 110 may be disposed in the lower interlayer insulating layer 105. A selection component (e.g., a diode or a field effect transistor) may be formed on the substrate 100, and the lower interlayer insulating layer 105 may cover the selection component. The lower contact plug 110 may be connected to one terminal of the selection component. The lower interlayer insulating layer 105 may include at least one of, but not limited to, a silicon oxide layer, a silicon nitride layer, or a silicon oxynitride layer. For example, the lower contact plug 110 may include at least one of a doped semiconductor material (e.g., doped silicon), a metal (e.g., tungsten, aluminum, copper, titanium, and/or tantalum), a conductive metal nitride (e.g., titanium nitride, tantalum nitride, and/or tungsten nitride), or a metal-semiconductor compound (e.g., a metal silicide).

A bottom electrode 115a may be disposed on the lower interlayer insulating layer 105 and a top surface of the lower contact plug 110. The bottom electrode 115a may be electrically connected to the one terminal of the selection component through the lower contact plug 110. The reference magnetic pattern 120a, the tunnel barrier pattern 125a, and the free magnetic pattern 130a may be sequentially stacked on a top surface of the bottom electrode 115a. The metal boride pattern 140a and the sub-oxide pattern 150a may be sequentially stacked on the top surface of the free magnetic pattern 130a. In an embodiment, a capping electrode 160a may be disposed on a top surface of the sub-oxide pattern 150a.

The reference and free magnetic patterns 120a and 130a, the tunnel barrier pattern 125a, the metal boride pattern 140a, and the sub-oxide pattern 150a may constitute a magnetic tunnel junction (MTJ) pattern. The magnetization directions RM and FM of the reference magnetic pattern 120a and the free magnetic pattern 130a may be substantially perpendicular to the first surface (e.g., the bottom surface) of the free magnetic pattern 130a. The magnetization direction FM of the free magnetic pattern 130a may become parallel to the magnetization direction RM of the reference magnetic pattern 120a by a first program operation. In this case, the MTJ pattern may have a first resistance value. On the other hand, the magnetization direction FM of the free magnetic pattern 130a may become anti-parallel to the magnetization direction RM of the reference magnetic pattern 120a by a second program operation. In this case, the MTJ pattern may have a second resistance value greater than the first resistance value. The MTJ pattern may store logical data using a difference between the resistance values. The magnetization direction FM of the free magnetic pattern 130a may be changed using spin torques of electrons included in first and second program currents of the first and second program operations.

The reference magnetic pattern 120a may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) crystal structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked. For example, the perpendicular magnetic structure may include at least one of a (Co/Pt)n stack structure, a (CoFe/Pt)n stack structure, a (CoFe/Pd)n stack structure, a (Co/Pd)n, (Co/Ni)n stack structure, a (CoNi/Pt)n stack structure, a (CoCr/Pt)n stack structure, or a (CoCr/Pd)n stack structure, where "n" denotes the number of bilayers.

The bottom electrode 115a may include at least one of a conductive metal nitride and a metal. In an embodiment, the bottom electrode 115a may function as a seed of the reference magnetic pattern 120a. For example, if the reference magnetic pattern 120a is formed of the perpendicular magnetic material having the $L1_0$ structure, the bottom electrode 115a may include a conductive metal nitride having a sodium chloride (NaCl) crystal structure, e.g., titanium nitride, tantalum nitride, chrome nitride, or vanadium nitride. Alternatively, if the reference magnetic pattern 120a has the HCP crystal structure, the bottom electrode 115a may include a conductive material having the HCP crystal structure, e.g., ruthenium. However, the inventive concepts are not limited thereto. The bottom electrode 115a may include another conductive material (e.g., titanium or tantalum).

The tunnel barrier pattern 125a may include at least one of magnesium oxide, titanium oxide, aluminum oxide, magnesium-zinc oxide, or magnesium-boron oxide. In an embodiment, the tunnel barrier pattern 125a may include magnesium oxide having the NaCl crystal structure.

The free magnetic pattern 130a may include at least one magnetic element. Iron (Fe), nickel (Ni), and cobalt (Co) may be the magnetic elements. In an embodiment, the free magnetic pattern 130a may include a magnetic element that is combined with oxygen to induce interface perpendicular magnetic anisotropy (i-PMA). For example, the free magnetic pattern 130a may include cobalt-iron (CoFe) or cobalt-iron-boron (CoFeB). The free magnetic pattern 130a may be in a crystalline state. In an embodiment, at least a portion of the free magnetic pattern 130a may have a body-centered cubic (BCC) crystal structure. If the free magnetic pattern 130a includes cobalt-iron-boron (CoFeB), a bottom concentration of the crystalline portion of the free magnetic pattern 130a may be lower than 10 at %.

Oxygen atoms may exist at an interface between the metal boride pattern 140a and the free magnetic pattern 130a. The oxygen atoms may be combined with magnetic atoms (e.g., iron atoms) of the free magnetic pattern 130a to induce the interface perpendicular magnetic anisotropy (i-PMA) at the interface between the metal boride pattern 140a and the free magnetic pattern 130a. The oxygen atoms may be supplied from the sub-oxide pattern 150a to the interface between the free magnetic pattern 130a and the metal boride pattern 140a. In other words, the sub-oxide pattern 150a may act as a source of the oxygen atoms supplied to the interface between the free magnetic pattern 130a and the metal boride pattern 140a.

The magnetic atoms (e.g., the iron atoms) of the free magnetic pattern 130a may be combined with oxygen atoms of the tunnel barrier pattern 125a at an interface between the tunnel barrier pattern 125a and the free magnetic pattern 130a. Thus, the interface perpendicular magnetic anisotropy (i-PMA) may also be induced at the interface between the tunnel barrier pattern 125a and the free magnetic pattern 130a. The magnetization direction FM of the free magnetic pattern 130a may be substantially perpendicular to the bottom surface of the free magnetic pattern 130a by the interface perpendicular magnetic anisotropy (i-PMA) induced at the interfaces of the free magnetic pattern 130a.

The metal boride pattern 140a may include a metal and boron. Here, the boride-formation energy of the metal of the metal boride pattern 140a may be lower than the boride-formation energy of the magnetic element of the free magnetic pattern 130a. For example, the metal of the metal boride pattern 140a may include at least one of tantalum (Ta), titanium (Ti), tungsten (W), hafnium (Hf), zirconium (Zr), scandium (Sc), niobium (Nb), or vanadium (V). Thus, the metal boride pattern 140a may include at least one of tantalum boride, titanium boride, tungsten boride, hafnium boride, zirconium boride, scandium boride, niobium boride, or vanadium boride.

A boron concentration of the metal boride pattern 140a may be higher than a boron concentration of the free magnetic pattern 130a. Here, the free magnetic pattern 130a may include boron or may not include boron. In an embodiment, the free magnetic pattern 130a may include a crystalline portion and an amorphous portion. The crystalline portion of the free magnetic pattern 130a may be adjacent to the tunnel barrier pattern 125a, and the amorphous portion of the free magnetic pattern 130a may be adjacent to the metal boride pattern 140a. In an embodiment, the boron concentration of the amorphous portion of the free magnetic pattern 130a may be higher than that of the crystalline portion of the free magnetic pattern 130a. In this case, the boron concentration of at least a portion (e.g., a central portion) of the metal boride pattern 140a may be higher than that of the amorphous portion of the free magnetic pattern 130a. In other words, the maximum boron concentration of the metal boride pattern 140a may be higher than the maximum boron concentration of the free magnetic pattern 130a. In other embodiments, the free magnetic pattern 130a may have a uniform boron concentration, and the metal boride pattern 140a may also have a uniform boron concentration. Here, the uniform boron concentration of the metal boride pattern 140a may be higher than the uniform boron concentration of the free magnetic pattern 130a. In still other embodiments, the free magnetic pattern 130a may not include boron. In some embodiments, the boron concentration of the metal boride pattern 140a may be in a range of about 1 at % to about 50 at %.

The metal boride pattern 140a may inhibit the oxygen atoms included in the sub-oxide pattern 150a from diffusing into the inside of the free magnetic pattern 130 and/or the tunnel barrier pattern 125a. Thus, it is possible to minimize or prevent deterioration of characteristics of the MTJ pattern.

If the metal boride pattern 140a does not exist, the oxygen atoms of the sub-oxide pattern 150a may diffuse excessively into the inside of the free magnetic pattern 130a and/or the tunnel barrier pattern 125a. Thus, the free magnetic pattern 130a may be partially oxidized and/or an oxygen concentration of the tunnel barrier pattern 125a may be increased. As a result, a total resistance of the MTJ pattern may be increased, so characteristics of the MTJ pattern may be deteriorated. However, in embodiments of the inventive concepts, the metal boride pattern 140a may be disposed between the sub-oxide pattern 150a and the free magnetic pattern 130a to inhibit the diffusion of the oxygen atoms of the sub-oxide pattern 150a. In other words, the deterioration of the characteristics of the MTJ pattern may be minimized or prevented.

A thickness of the metal boride pattern 140a may be in a range of about 0.5 Å to about 10 Å. Since the metal boride pattern 140a is thin, the oxygen atoms of the sub-oxide pattern 150a may be provided to the interface between the metal boride pattern 140a and the free magnetic pattern 130a. In an embodiment, the metal boride pattern 140a may further include oxygen.

The sub-oxide pattern 150a may include an oxide. In some embodiments, the sub-oxide pattern 150a may be formed of a metal oxide including the same metal as the metal boride pattern 140a. For example, the sub-oxide pattern 150a may include at least one of tantalum oxide, titanium oxide, tungsten oxide, hafnium oxide, zirconium oxide, scandium oxide, niobium oxide, or vanadium oxide. The sub-oxide pattern 150a may have a thin thickness capable of transmitting a current. For example, a thickness of the sub-oxide pattern 150a may be in a range of about 0.5 Å to about 30 Å.

The capping electrode 160a may protect the sub-oxide pattern 150a. For example, the capping electrode 160a may include a metal (e.g., ruthenium (Ru) or tantalum (Ta)). The capping electrode 160a may further include a conductive metal nitride. In an embodiment, the capping electrode 160a may be formed of only the conductive metal nitride.

The reference magnetic pattern 120a may have a synthetic anti-ferromagnetic (SAF) structure. In this case, the reference magnetic pattern 120a may include a first pinned pattern, a second pinned pattern disposed between the first pinned pattern and the tunnel barrier pattern 125a, and an exchange coupling pattern disposed between the first and second pinned patterns. Each of the first and second pinned patterns may include at least one of the perpendicular magnetic material (e.g., CoFeTb, CoFeGd, or CoFeDy), the perpendicular magnetic material having the $L1_0$ structure, the CoPt alloy having the HCP crystal structure, or the perpendicular magnetic structure. Magnetization directions of the first and second pinned patterns may be coupled in anti-parallel to each other by the exchange coupling pattern. For example, the exchange coupling pattern may couple the magnetization directions of the first and second pinned patterns to each other by Ruderman-Kittel-Kasuya-Yosida (RKKY) interaction. The exchange coupling pattern may include, for example, ruthenium (Ru). Since the reference magnetic pattern 120a has the SAF structure, it is possible to reduce or minimize the influence of a magnetic field of the reference magnetic pattern 120a upon the free magnetic pattern 130a.

In an embodiment, the second pinned pattern adjacent to the tunnel barrier pattern 125a may further include a polarization enhancement magnetic pattern. The polarization enhancement magnetic pattern may include at least one magnetic element. In an embodiment, the polarization enhancement magnetic pattern may include a magnetic element (e.g., iron) capable of inducing interface perpendicular magnetic anisotropy (i-PMA) at an interface between the tunnel barrier pattern 125a and the polarization enhancement magnetic pattern. In an embodiment, the polarization enhancement magnetic pattern may have a crystalline structure. For example, the polarization enhancement magnetic pattern may have a BCC crystal structure. The polarization enhancement magnetic pattern may include CoFe or CoFeB. If the polarization enhancement magnetic pattern includes CoFeB, a boron concentration of the polarization enhancement magnetic pattern may be lower than 10 at %. Thus, the polarization enhancement magnetic pattern may have the crystalline structure. A magnetization direction of the polarization enhancement magnetic pattern may be substantially perpendicular to the bottom surface of the free magnetic pattern 130a by the magnetization of the perpendicular magnetic material or the perpendicular magnetic structure of the second pinned pattern and the interface perpendicular magnetic anisotropy (i-PMA) between the tunnel barrier pattern 125a and the polarization enhancement magnetic pattern.

If the reference magnetic pattern 120a has the SAF structure, the magnetization direction of the second pinned pattern adjacent to the tunnel barrier pattern 125a may correspond to the magnetization direction RM of the reference magnetic pattern 120a.

Referring again to FIG. 1, sidewalls of the electrodes 115a and 160a and the patterns 120a, 125a, 130a, 140a, and 150a may be aligned with each other. An upper interlayer insulating layer 165 may be disposed on the lower interlayer insulating layer 105, the MTJ pattern, and the capping electrode 160a. For example, the upper interlayer insulating layer 165 may include at least one of a silicon oxide layer, a silicon nitride layer, or a silicon oxynitride layer.

An upper contact plug 170 may penetrate the upper interlayer insulating layer 165 to be connected to the capping electrode 160a. The upper contact plug 170 may be formed of a conductive material (e.g., a conductive metal nitride and/or a metal). An interconnection 175 may be disposed on the upper interlayer insulating layer 165 to be connected to the upper contact plug 170. In other words, the interconnection 175 may be electrically connected to the MTJ pattern through the upper contact plug 170. Alternatively, the upper contact plug 170 may be omitted and the upper interlayer insulating layer 165 may expose a top surface of the capping electrode 160a. In other words, a top surface of the upper interlayer insulating layer 165 may be substantially coplanar with the top surface of the capping electrode 160a. In this case, the interconnection 175 may be in direct contact with the top surface of the capping electrode 160a. In an embodiment, the interconnection 175 may be a bit line. The interconnection 175 may be formed of a conductive material (e.g., a conductive metal nitride and/or a metal).

As described above, the metal boride pattern 140a may inhibit the oxygen atoms of the sub-oxide pattern 150a from diffusing into the inside of the free magnetic pattern 130a and/or the tunnel barrier pattern 125a, so the deterioration of the characteristics of the MTJ pattern may be minimized or prevented. As a result, the magnetic memory device with excellent reliability may be realized.

FIGS. 2 to 6 are cross-sectional views illustrating a method of manufacturing a magnetic memory device according to some embodiments of the inventive concepts. FIG. 7 is a flowchart illustrating a method of forming a metal boride layer and a sub-oxide layer according to some embodiments of the inventive concepts.

Figure 2:
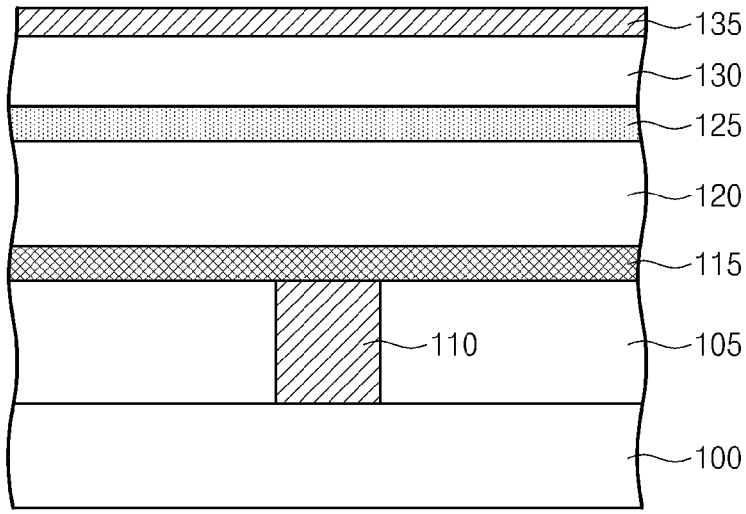
FIGS. 2 to 6 are cross-sectional views illustrating a method of manufacturing a magnetic memory device according to some embodiments of the inventive concepts.

Referring to FIG. 2, a lower interlayer insulating layer 105 may be formed on a substrate 100. A lower contact plug 110 may be formed in the lower interlayer insulating layer 105. As described with reference to FIG. 1, the lower contact plug 110 may be electrically connected to the one terminal of the selection component disposed under the lower interlayer insulating layer 105.

A bottom electrode layer 115 may be formed on the lower interlayer insulating layer 105. The bottom electrode layer 115 may be formed by at least one of a physical vapor deposition (PVD) process (e.g., a sputtering process), a chemical vapor deposition (CVD) process, or an atomic layer deposition (ALD) process. The bottom electrode layer 115 may include the same material as the bottom electrode 115a described with reference to FIG. 1. The bottom electrode layer 115 may be in contact with the lower contact plug 110.

A reference magnetic layer 120, a tunnel barrier layer 125, and a free magnetic layer 130 may be sequentially formed on the bottom electrode layer 115. The reference magnetic layer 120 may include the same material as the reference magnetic pattern 120a described with reference to FIG. 1, and the tunnel barrier layer 125 may include the same material as the tunnel barrier pattern 125a described with reference to FIG. 1. Each of the reference magnetic layer 120 and the tunnel barrier layer 125 may be formed by a PVD process, a CVD process, or an ALD process.

The free magnetic layer 130 may be deposited by a deposition process (e.g., a PVD process or an ALD process). The free magnetic layer 130 may include at least one magnetic element. Iron (Fe), nickel (Ni), and cobalt (Co) may be the magnetic elements. In particular, the free magnetic layer 130 may include a magnetic element (e.g., iron) that is combined with oxygen to induce interface perpendicular magnetic anisotropy (i-PMA). In an embodiment, the free magnetic layer 130 may further include boron. For example, the free magnetic layer 130 may be formed of cobalt-iron-boron (CoFeB). The deposited free magnetic layer 130 may be in an amorphous state. For example, if the free magnetic layer 130 is formed of CoFeB, a boron concentration of the deposited free magnetic layer 130 may be higher than about 10 at %. The CoFeB having the boron concentration higher than about 10 at % may be in an amorphous state.

Referring to FIGS. 2 and 7, a metal layer 135 may be formed on the free magnetic layer 130 (S200). The metal layer 135 may be deposited by a deposition process (e.g., a PVD process or an ALD process). The metal layer 135 may include a metal that has a boride-formation energy lower than a boride-formation energy of the magnetic element (e.g., cobalt and iron) of the free magnetic layer 130. For example, the metal layer 135 may include at least one of tantalum (Ta), titanium (Ti), tungsten (W), hafnium (Hf), zirconium (Zr), scandium (Sc), niobium (Nb), or vanadium (V). In an embodiment, a thickness of the metal layer 135 may be in a range of about 0.5 Å to about 30 Å.

Figure 3:
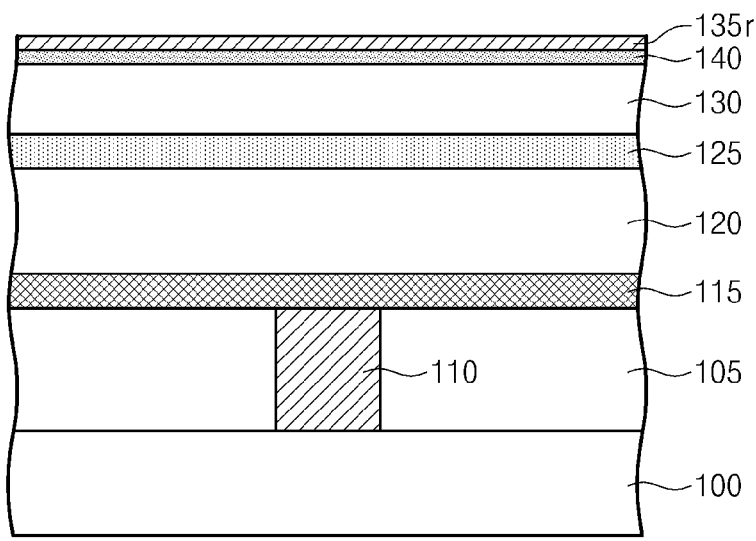

Referring to FIGS. 3 and 7, an annealing process may be performed to form a metal boride layer 140 on the free magnetic layer 130 (S202). Boron atoms included in the free magnetic layer 130 may diffuse into a lower portion of the metal layer 135 by the annealing process, so the metal boride layer 140 may be formed. In other words, the lower portion of the metal layer 135 may be converted into the metal boride layer 140 by the annealing process. At this time, an upper portion 135r of the metal layer 135 may remain. In an embodiment, a thickness of the metal boride layer 140 may be in a range of about 0.5 Å to about 10 Å.

Since the boron atoms of the free magnetic layer 130 escape from the free magnetic layer 130 by the annealing process, a phase of at least a portion of the free magnetic layer 130 may be converted into a crystalline state. For example, the crystalline portion of the free magnetic layer 130 may have a body-centered cubic (BCC) crystal structure. A boron concentration of the crystalline portion of the free magnetic layer 130 may be lower than about 10 at %.

As described above, the boride-formation energy of the metal of the metal layer 135 is lower than that of the magnetic element of the free magnetic layer 130. Thus, during the annealing process, the metal of the metal layer 135 may be more easily combined with boron than the magnetic element of the free magnetic layer 130. In other words, during the annealing process, the metal of the metal layer 135 may be more easily combined with boron than the magnetic element of the free magnetic layer 130.

To diffuse the boron atoms into the lower portion of the metal layer 135, the annealing process may be performed at a process temperature of at least about 275° C. In other words, the process temperature of the annealing process may be equal to or greater than about 275° C. In the present embodiment, the reference magnetic layer 120 exists under the free magnetic layer 130 during the annealing process. Thus, the process temperature of the annealing process may be equal to or lower than a critical temperature of the reference magnetic layer 120. The critical temperature of the reference magnetic layer 120 may be defined as the maximum temperature capable of maintaining the perpendicular magnetization property of the reference magnetic layer 120. In other words, if heat budget of a temperature higher than the critical temperature is supplied to the reference magnetic layer 120, the reference magnetic layer 120 may lose the perpendicular magnetization property. For example, the critical temperature of the reference magnetic layer 120 may be about 450° C. Thus, the process temperature of the annealing process according to the present embodiment may be in a range of about 275° C. to about 450° C.

After the annealing process, the boron concentration of the metal boride layer 140 may be higher than that of the free magnetic layer 130. In an embodiment, a crystal structure of the free magnetic layer 130 may match a crystal structure of the metal boride layer 140 during the annealing process. In another embodiment, after the annealing process, the free magnetic layer 130 may include a crystalline portion adjacent to the tunnel barrier layer 125 and an amorphous portion adjacent to the metal boride layer 140. In this case, the boron concentration of at least a portion of the metal boride layer 140 may be higher than that of the amorphous portion of the free magnetic layer 130. The annealing process may be performed by an annealing process using a furnace, a rapid thermal annealing process, or a laser annealing process. However, the inventive concepts are not limited thereto. In another embodiment, the annealing process may be performed by another type of an annealing process.

Figure 4:
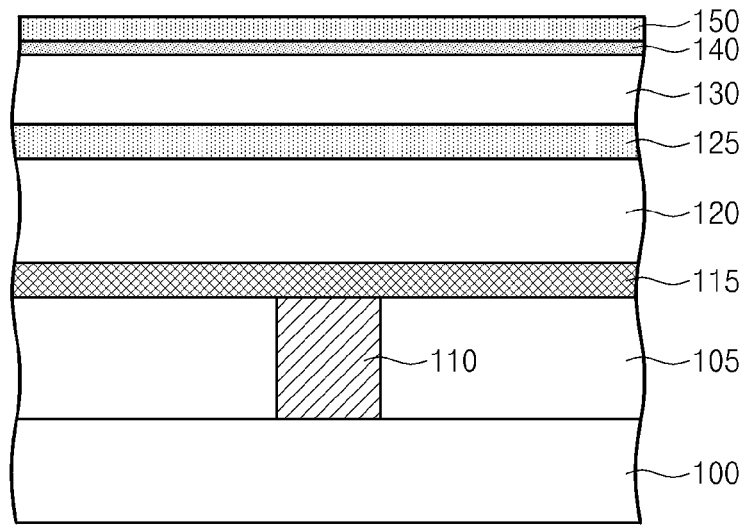

Referring to FIGS. 4 and 7, an oxidation process may be performed to form a sub-oxide layer 150 on the metal boride layer 140 (S204). Oxygen atoms may be provided into the remaining portion 135r of the metal layer by the oxidation process, so the sub-oxide layer 150 may be formed. In other words, the remaining portion 135r of the metal layer may be converted into the sub-oxide layer 150 by the oxidation process. In an embodiment, a thickness of the sub-oxide layer 150 may be in a range of about 0.5 Å to about 30 Å.

Oxygen atoms included in the sub-oxide layer 150 may be provided to an interface between the metal boride layer 140 and the free magnetic layer 130 during the oxidation process. At this time, the metal boride layer 140 may inhibit the oxygen atoms from diffusing into the inside of the free magnetic layer 130 and/or the tunnel barrier layer 125. The oxygen atoms provided to the interface between the metal boride layer 140 and the free magnetic layer 130 may be combined with the magnetic atoms (e.g., iron atoms) of the free magnetic layer 130 to induce interface perpendicular magnetic anisotropy (i-PMA). Since the oxygen atoms diffuse to the interface during the oxidation process, the metal boride layer 140 may further include oxygen.

Since the sub-oxide layer 150 and the metal boride layer 140 are formed using the metal layer 135, the sub-oxide layer 150 may include the same metal as the metal boride layer 140. The oxidation process may be performed using an oxygen source gas (e.g., an oxygen ($O_2$) gas). For example, a process temperature of the oxidation process may be in a range of about 200° C. to about 300° C. A crystal structure of the sub-oxide layer 150 may match the crystal structure of the metal boride layer 140 during the oxidation process.

Figure 8:
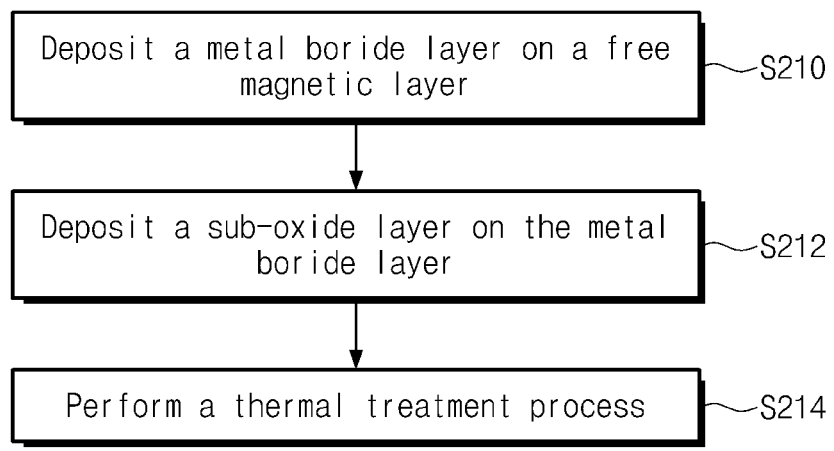
FIG. 8 is a flowchart illustrating a method of forming a metal boride layer and a sub-oxide layer according to some embodiments of the inventive concepts.

The metal boride layer 140 and the sub-oxide layer 150 may be formed by another method. This will be described in more detail with reference to FIG. 8. FIG. 8 is a flowchart illustrating a method of forming a metal boride layer and a sub-oxide layer according to some embodiments of the inventive concepts.

Referring to FIGS. 4 and 8, a metal boride layer 140 may be deposited on the free magnetic layer 130 by a deposition process (S210). For example, the metal boride layer 140 may be deposited by a PVD process, a CVD process, or an ALD process. In this case, the free magnetic layer 130 may be deposited in a crystalline state. In addition, the deposited free magnetic layer 130 may not include boron or may have a boron concentration lower than about 10 at %. Alternatively, even though the metal boride layer 140 is deposited by the deposition process, the deposited free magnetic layer 130 may be in an amorphous state and may include boron. This will be described later in more detail.

A sub-oxide layer 150 may be deposited on the metal boride layer 140 by a deposition process (e.g., a PVD process, a CVD process, or an ALD process) (S212). In an embodiment, the deposited sub-oxide layer 150 may be formed of a metal oxide including the same metal as the deposited metal boride layer 140. Alternatively, the deposited sub-oxide layer 150 may be formed of a metal oxide having a different metal from the deposited metal boride layer 140.

A thermal treatment process may be performed to diffuse oxygen atoms included in the deposited sub-oxide layer 150 to an interface between the metal boride layer 140 and the free magnetic layer 130 (S214). The oxygen atoms may be combined with the magnetic atoms (e.g., iron atoms) of the free magnetic layer 130 to induce the interface perpendicular magnetic anisotropy (i-PMA). If the deposited free magnetic layer 130 is in the amorphous state, boron atoms included in the deposited free magnetic layer 130 may escape from the free magnetic layer 130 by the thermal treatment process, so a phase of at least a portion of the free magnetic layer 130 may be converted into a crystalline state. At this time, if a process temperature of the thermal treatment process is lower than about 275° C., the boron atoms of the free magnetic layer 130 do not diffuse into the metal boride layer 140.

Crystalline structures of the free magnetic layer 130, the deposited metal boride layer 140 and the deposited sub-oxide layer 140 may match each other by the thermal treatment process (S214). For example, the process temperature of the thermal treatment process may be in a range of about 200° C. to about 300° C. In another embodiment, the thermal treatment process may be omitted. In this case, the oxygen atoms of the deposited sub-oxide layer 150 may diffuse into the interface between the metal boride layer 140 and the free magnetic layer 130 by a process temperature of a subsequent process.

Figure 5:
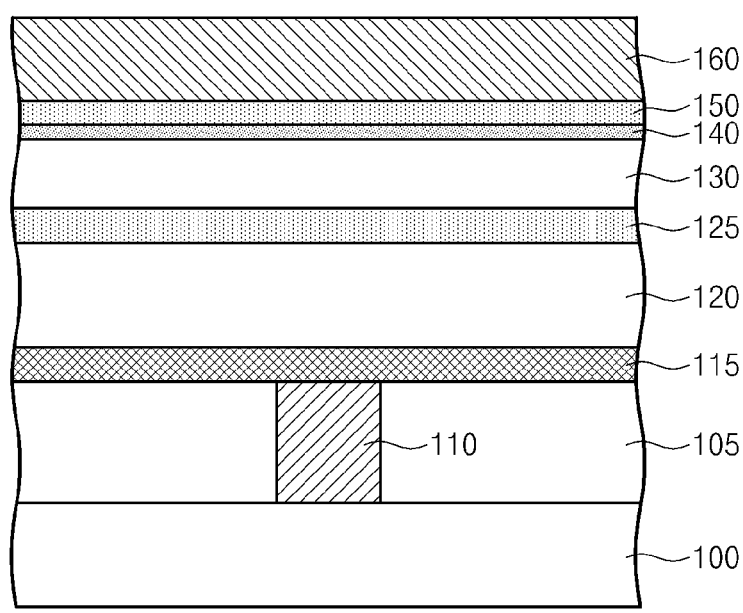

Referring to FIG. 5, a capping electrode layer 160 may be formed on the sub-oxide layer 150. The capping electrode layer 160 may be formed of the same material as the capping electrode 160a described with reference to FIG. 1.

Figure 6:
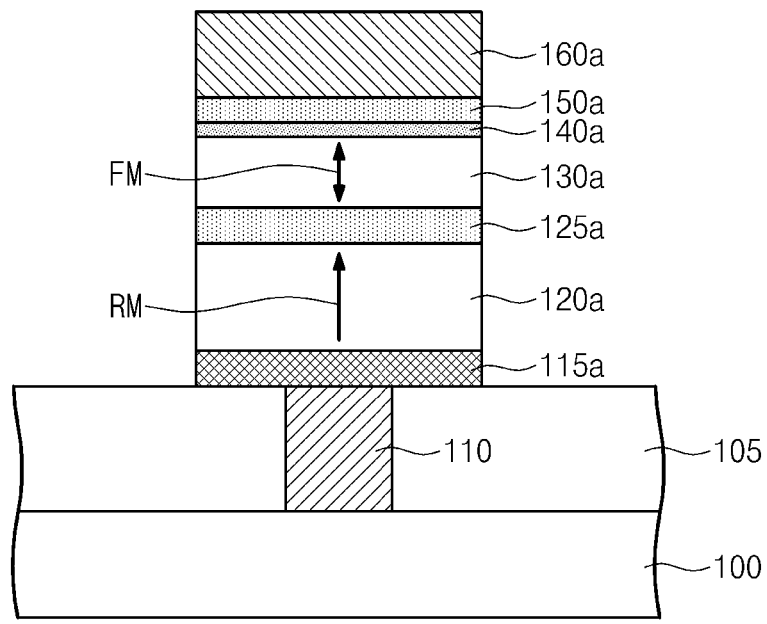
Figure 7:
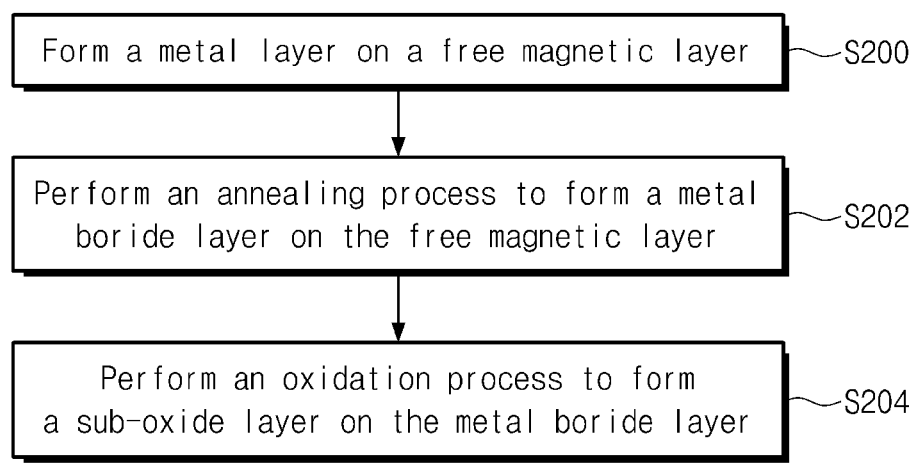
FIG. 7 is a flowchart illustrating a method of forming a metal boride layer and a sub-oxide layer according to some embodiments of the inventive concepts.

Referring to FIG. 6, the capping electrode layer 160, the sub-oxide layer 150, the metal boride layer 140, the free magnetic layer 130, the tunnel barrier layer 125, the reference magnetic layer 120, and the bottom electrode layer 115 may be sequentially patterned to form a bottom electrode 115a, a reference magnetic pattern 120a, a tunnel barrier pattern 125a, a free magnetic pattern 130a, a metal boride pattern 140a, a sub-oxide pattern 150a, and a capping electrode 160 which are sequentially stacked.

Next, the upper interlayer insulating layer 165, the upper contact plug 170, and the interconnection 175 of FIG. 1 may be formed to realize the magnetic memory device illustrated in FIG. 1.

Figure 9:
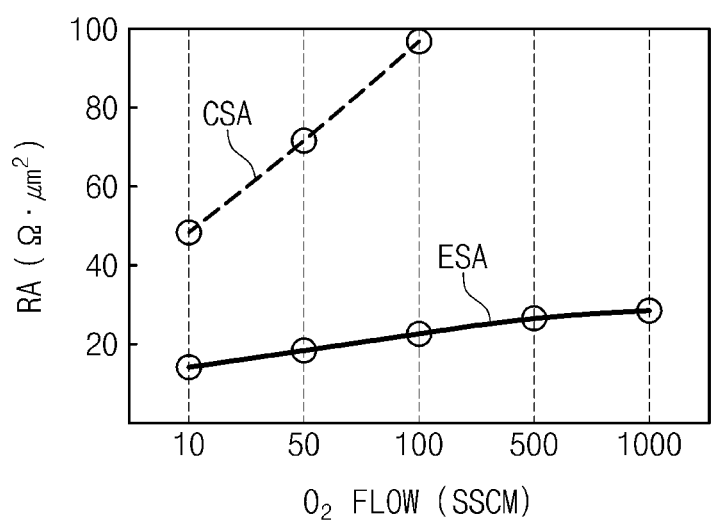
FIG. 9 is a graph illustrating characteristics of a magnetic memory device according to some embodiments of the inventive concepts.

An experiment was performed to confirm the characteristics of the metal boride pattern 140a of the magnetic memory device according to the inventive concepts. This experiment will be described in detail with reference to a graph of FIG. 9. FIG. 9 is a graph illustrating characteristics of a magnetic memory device according to some embodiments of the inventive concepts.

First samples and second samples were prepared for the experiment. The first samples were formed to include the metal boride patterns 140a according to embodiments of the inventive concepts. The metal boride pattern 140a was not formed in the second samples. The first samples were formed using the method described with reference to the flowchart of FIG. 7. The second samples were formed using the steps S200 and S204 of FIG. 7. In other words, the step S202 (i.e., the step of forming the metal boride layer) of FIG. 7 was not performed when the second samples were formed. Oxygen flow rates of the oxidation processes (S204) of the first samples were different from each other. Also, oxygen flow rates of the oxidation processes (S204) of the second samples were different from each other. The graph of FIG. 9 shows total resistance values RA of the first and second samples according to the oxygen flow rate. The total resistance value RA means a resistance value of the MTJ pattern when the MTJ pattern is in a low resistance state.

Referring to FIG. 9, a first line ESA shows the total resistance values RA of the first samples, and a second line CSA shows the total resistance values RA of the second samples. As illustrated in FIG. 9, even though the oxygen flow rate increases, the total resistance values RA of the first samples including the metal boride patterns 140a are stably maintained under about 40 $\Omega \cdot \mu m^2$. The total resistance values RA of the second samples not including the metal boride patterns 140a are higher than about 40 $\Omega \cdot \mu m^2$ and rapidly increase as the oxygen flow rate increases. According to an embodiment, the metal boride pattern 140a inhibits the oxygen atoms from diffusing into the inside of the free magnetic pattern 130a and/or the tunnel barrier pattern 125a.

Figure 10:
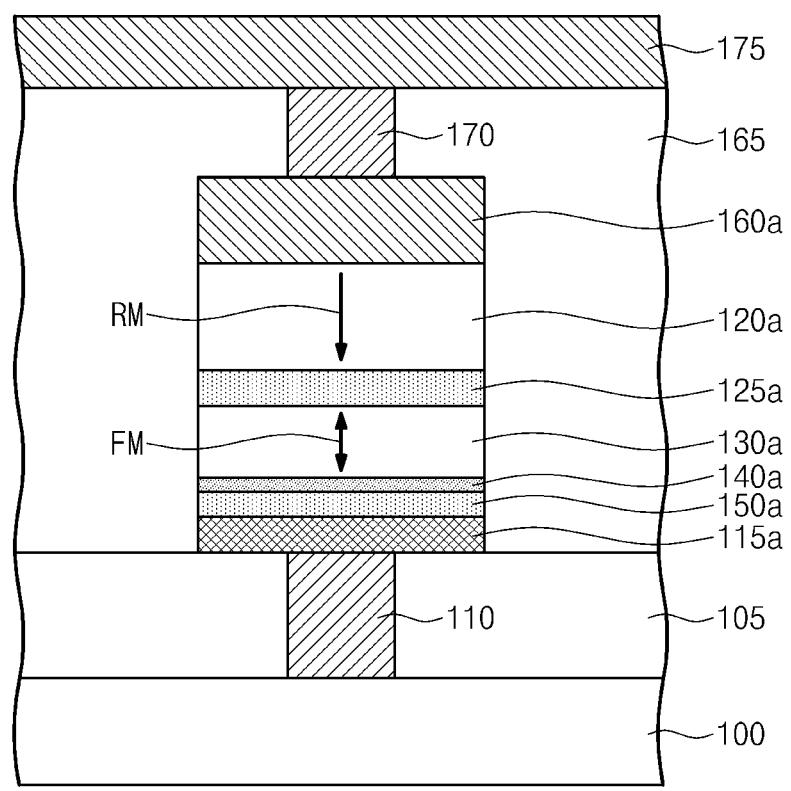
FIG. 10 is a cross-sectional view illustrating a magnetic memory device according to other embodiments of the inventive concepts.

FIG. 10 is a cross-sectional view illustrating a magnetic memory device according to other embodiments of the inventive concepts. Referring to FIG. 10, in the present embodiment, the free magnetic pattern 130a may be disposed under the tunnel barrier pattern 125a and the reference magnetic pattern 120a may be disposed on the tunnel barrier pattern 125a. In other words, the free magnetic pattern 130a, the tunnel barrier pattern 125a, and the reference magnetic pattern 120a may be sequentially stacked. In this case, a first surface of the free magnetic pattern 130a adjacent to the tunnel barrier pattern 125a may correspond to a top surface of the free magnetic pattern 130a, and a second surface of the free magnetic pattern 130a opposite to the first surface may correspond to a bottom surface of the free magnetic pattern 130a.

In the present embodiment, the sub-oxide pattern 150a may be disposed between the bottom electrode 115a and the free magnetic pattern 130a, and the metal boride pattern 140a may be disposed between the sub-oxide pattern 150a and the free magnetic pattern 130a. In other words, the sub-oxide pattern 150a, the metal boride pattern 140a, and the free magnetic pattern 130a may be sequentially stacked on the bottom electrode 115a. The capping electrode 160a may be disposed on a top surface of the reference magnetic pattern 120a.

If the reference magnetic pattern 120a has the SAF structure, the second pinned pattern, the exchange coupling pattern, and the first pinned pattern may be sequentially stacked on the top surface of the tunnel barrier pattern 125a.

Other features of the patterns 150a, 140a, 130a, 125a, and 120a may be the substantially same as corresponding features described with reference to FIG. 1 except the aforementioned positional features of the patterns 150a, 140a, 130a, 125a, and 120a.

FIGS. 11 to 14 are cross-sectional views illustrating a method of manufacturing a magnetic memory device according to other embodiments of the inventive concepts. FIG. 15 is a flowchart illustrating a method of forming a sub-oxide layer and a metal boride layer according to other embodiments of the inventive concepts.

Figure 11:
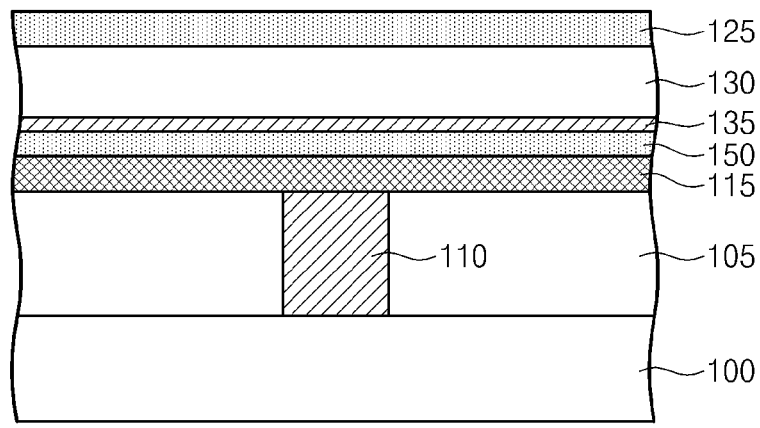
FIGS. 11 to 14 are cross-sectional views illustrating a method of manufacturing a magnetic memory device according to other embodiments of the inventive concepts.

Referring to FIGS. 11 and 15, a sub-oxide layer 150 may be formed on the bottom electrode layer 115. The sub-oxide layer 150 may be deposited by a deposition process (e.g., a PVD process, a CVD process, or an ALD process). A thickness of the sub-oxide layer 150 may be in a range of about 0.5 Å to about 30 Å.

A metal layer 135 may be formed on the sub-oxide layer 150 (S220). The metal layer 135 may include the same metal as the metal layer 135 described with reference to FIG. 2. However, the metal layer 135 according to the present embodiment may be thinner than the metal layer 135 of FIG. 2.

A free magnetic layer 130 may be formed on the metal layer 135 (S222). The free magnetic layer 130 may be deposited by a deposition process. The free magnetic layer 130 may be formed of the same material as the free magnetic layer 130 described with reference to FIG. 2. In addition, the deposited free magnetic layer 130 may be in an amorphous state. The tunnel barrier layer 125 may be formed on the free magnetic layer 130.

Figure 12:
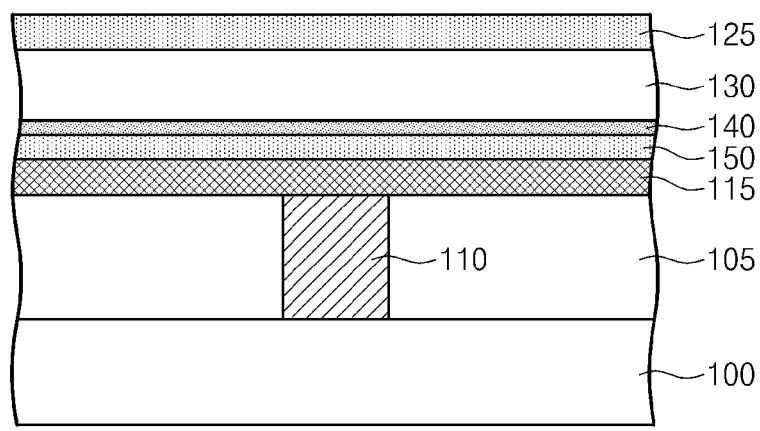

Referring to FIGS. 12 and 15, an annealing process may be performed to form a metal boride layer 140 between the sub-oxide layer 150 and the free magnetic layer 130 (S224). The annealing process may be the same as the annealing process of the step S202 described with reference to FIGS. 3 and 7. Thus, boron atoms included in the free magnetic layer 130 may be diffused into the metal layer 135 disposed under the free magnetic layer 130 by the annealing process, thereby forming the metal boride layer 140. A thickness of the metal boride layer 140 may be in a range of about 0.5 Å to about 10 Å, as describe with reference to FIG. 3. An entire portion of the metal layer 135 may be converted into the metal boride layer 140. Thus, the metal layer 135 of the present embodiment may be thinner than the metal layer 135 of FIG. 2.

During the annealing process, oxygen atoms of the sub-oxide layer 150 may diffuse into an interface between the metal boride layer 140 and the free magnetic layer 130 so as to be combined with the magnetic atoms of the free magnetic layer 130. Thus, the interface perpendicular magnetic anisotropy may be induced at the interface between the metal boride layer 140 and the free magnetic layer 130. In addition, a phase of the free magnetic layer 130 may be converted into a crystalline state by the annealing process.

As described above, the annealing process may be performed after the formation of the tunnel barrier layer 125. Alternatively, after the annealing process is performed, the tunnel barrier layer 125 may be formed on the free magnetic layer 130.

Figure 16:
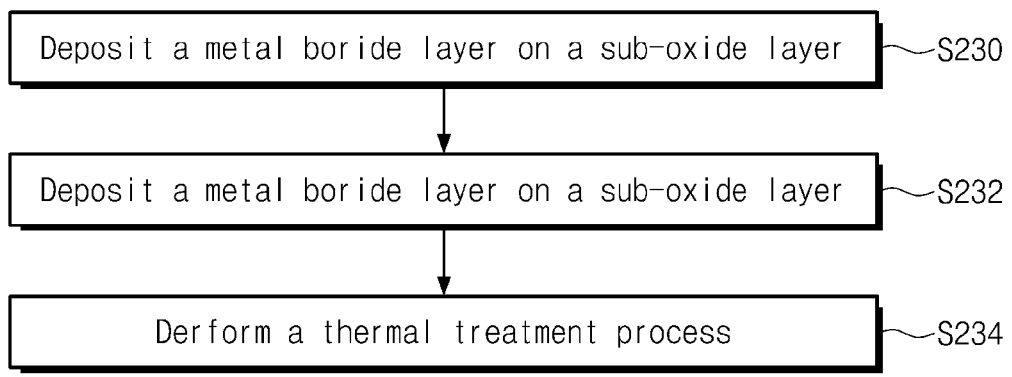
FIG. 16 is a flowchart illustrating a method of forming a metal boride layer according to other embodiments of the inventive concepts.

On the other hand, the metal boride layer 140 may be formed by another method. This will be described with reference to FIG. 16. FIG. 16 is a flowchart illustrating a method of forming a metal boride layer according to other embodiments of the inventive concepts.

Referring to FIGS. 12 and 16, a metal boride layer 140 may be deposited on the sub-oxide layer 150 by a deposition process (S230). For example, the metal boride layer 140 may be deposited by a PVD process, a CVD process, or an ALD process. The free magnetic layer 130 may be formed on the deposited metal boride layer 140 (S232). The tunnel barrier layer 125 may be formed on the free magnetic layer 130. A thermal treatment process may be performed to diffuse oxygen atoms of the sub-oxide layer 150 to an interface between the deposited metal boride layer 140 and the free magnetic layer 130 (S234). The thermal treatment process (S234) may be the same as the thermal treatment process (S214) described with reference to FIG. 8. Crystal structures of the sub-oxide layer 150, the metal boride layer 140 and the free magnetic layer 130 may match each other by the thermal treatment process (S234). In other embodiments, the thermal treatment process may be omitted. In this case, the oxygen atoms of the sub-oxide layer 150 may diffuse into the interface between the deposited metal boride layer 140 and the free magnetic layer 130 by a process temperature of a subsequent process.

Figure 13:
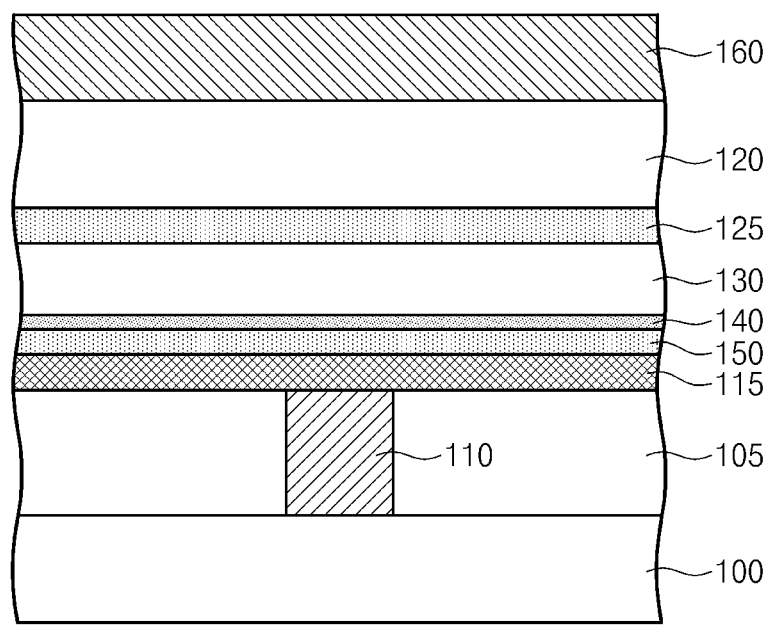

Referring to FIG. 13, the reference magnetic layer 120 and the capping electrode layer 160 may be sequentially formed on the tunnel barrier layer 125.

Figure 14:
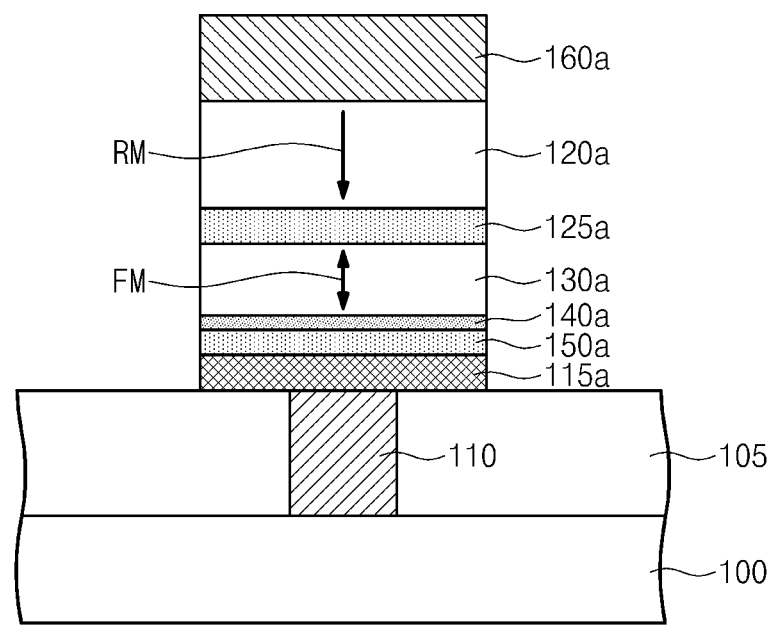
Figure 15:
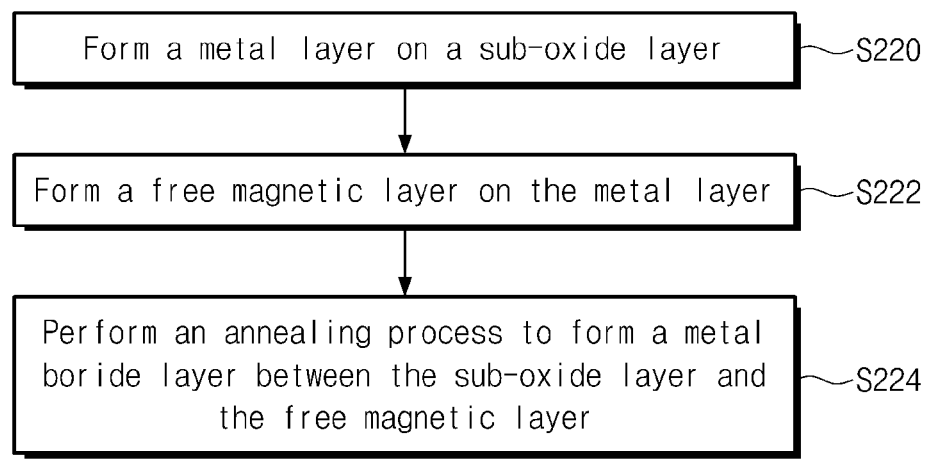
FIG. 15 is a flowchart illustrating a method of forming a metal boride layer according to other embodiments of the inventive concepts.

Referring to FIG. 14, the layers 160, 120, 125, 130, 140, 150, and 115 may be sequentially patterned to form a bottom electrode 115a, a sub-oxide pattern 150a, a metal boride pattern 140a, a free magnetic pattern 130a, a tunnel barrier pattern 125a, a reference magnetic pattern 120a, and a capping electrode 160a which are sequentially stacked.

Next, the upper interlayer insulating layer 165, the upper contact plug 170, and the interconnection 175 of FIG. 10 may be formed to realize the magnetic memory device illustrated in FIG. 10.

The magnetic memory devices described above may be encapsulated using various packaging techniques. For example, the magnetic memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the magnetic memory device according to one of the above embodiments is mounted may further include at least one semiconductor device (e.g., a controller and/or a logic device) that controls the magnetic memory device.

Figure 17:
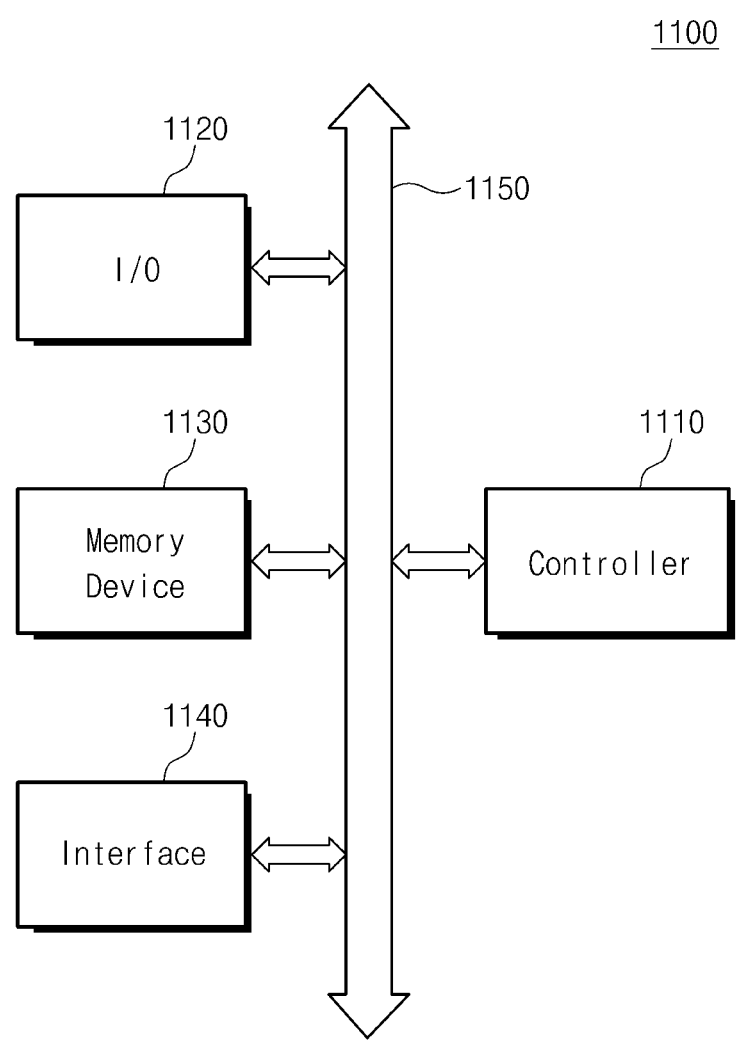
FIG. 17 is a schematic block diagram illustrating an electronic system including a magnetic memory device according to embodiments of the inventive concepts.

FIG. 17 is a schematic block diagram illustrating an electronic system including a magnetic memory device according to embodiments of the inventive concepts.

Referring to FIG. 17, an electronic system 1100 according to embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device having a similar function to any one thereof. The I/O unit 1120 may include a keypad, a keyboard and/or a display device. The memory device 1130 may store data and/or commands. The memory device 1130 may include at least one of the magnetic memory devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data in wireless environment.

Figure 18:
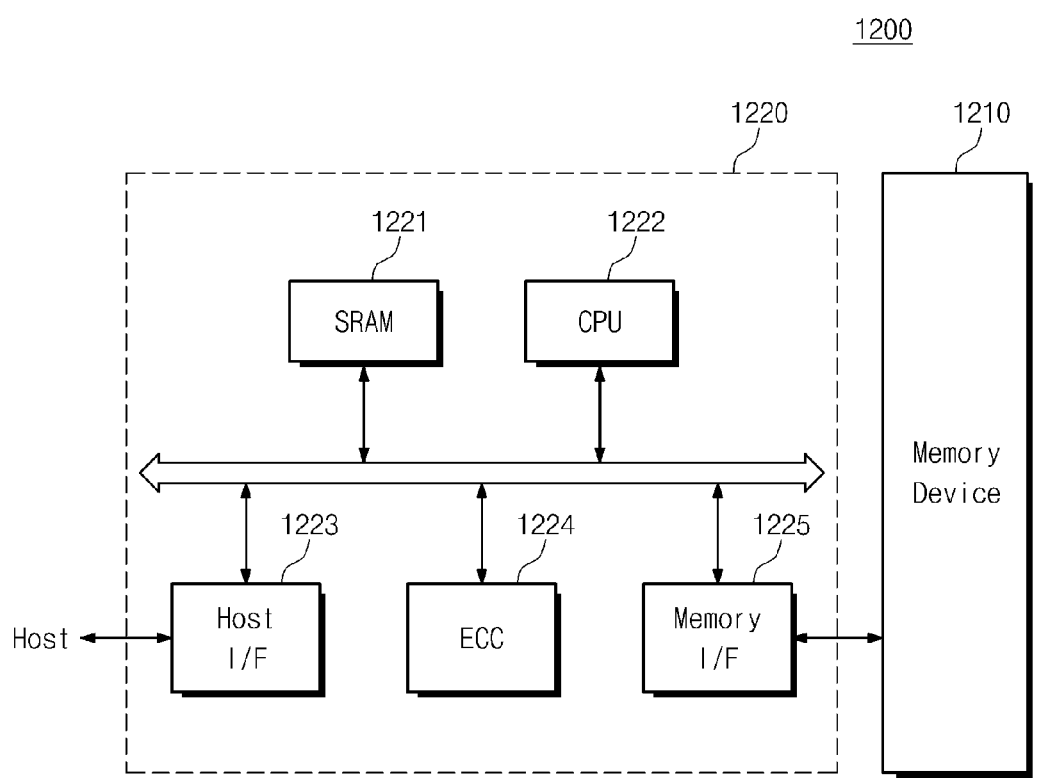
FIG. 18 is a schematic block diagram illustrating a memory system including a magnetic memory device according to embodiments of the inventive concepts.

FIG. 18 is a schematic block diagram illustrating a memory system including a magnetic memory device according to embodiments of the inventive concepts.

Referring to FIG. 18, a memory system 1200 according to embodiments of the inventive concepts may include a memory device 1210. The memory device 1210 may include at least one of the magnetic memory devices according to the embodiments mentioned above. The memory system 1200 may include a memory controller 1220 that controls data communication between a host and the memory device 1210.

The memory controller 1220 may include a central processing unit (CPU) 1222 that controls overall operations of the memory system 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory system 1200 may further include a read only memory (ROM) device that stores code data to interface with the host. The memory system 1200 may be used as a portable data storage card. Alternatively, the memory system 1200 may be realized as solid state disks (SSD) which are used as hard disks of computer systems.

As described above, the metal boride pattern is disposed between the sub-oxide pattern and the free magnetic pattern. The metal boride pattern may inhibit the oxygen atoms of the sub-oxide pattern from being diffused into the inside of the free magnetic pattern and/or the tunnel barrier pattern, so the deterioration of the characteristics of the magnetic memory device may be minimized or prevented to realize the magnetic memory device with excellent reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A memory device, comprising:
   a reference magnetic pattern having a magnetization direction fixed in one direction;
   a free magnetic pattern having a changeable magnetization direction;
   a tunnel barrier pattern disposed between the free magnetic pattern and the reference magnetic pattern, the free magnetic pattern having a first surface contacting the tunnel barrier pattern and a second surface opposite to the first surface; and
   a structure on the second surface of the free magnetic pattern, the structure including tantalum, boron, and oxygen,
   wherein the changeable magnetization direction of the free magnetic pattern and the magnetization direction of the reference magnetic pattern are substantially perpendicular to the first surface of the free magnetic pattern.

2. The memory device of claim 1, wherein the structure has a boron concentration other than a boron concentration of the free magnetic pattern.

3. The memory device of claim 1, wherein the structure includes a first portion and a second portion, the second portion being disposed between the first portion and the free magnetic pattern.

4. The memory device of claim 3, wherein the second portion has a boron concentration higher than a boron concentration of the first portion.

5. The memory device of claim 3, wherein the second portion includes the tantalum, the boron, and the oxygen.

6. The memory device of claim 3, wherein the first portion includes the tantalum, and the oxygen.

7. The memory device of claim 3, wherein a boron concentration of the second portion is higher than a boron concentration of the free magnetic pattern.

8. The memory device of claim 3, wherein the free magnetic pattern includes a crystalline portion and an amorphous portion,
   wherein a boron concentration of the amorphous portion is higher than a boron concentration of the crystalline portion.

9. The memory device of claim 8, wherein a boron concentration of the second portion is higher than the boron concentration of the amorphous portion.

10. The memory device of claim 8, wherein the amorphous portion is adjacent to the structure and the crystalline portion is adjacent to the tunnel barrier pattern.

11. The memory device of claim 8, wherein the boron concentration of the crystalline portion is lower than 10 at %.

12. The memory device of claim 1, wherein a thickness of the structure is in a range of about 1 Å to about 40 Å.

13. The memory device of claim 1, wherein the reference magnetic pattern, the tunnel barrier pattern, the free magnetic pattern, and the structure are sequentially stacked on a substrate.

14. A method of manufacturing a memory device, the method comprising:
sequentially forming a reference magnetic layer, a tunnel barrier layer, and a free magnetic layer on a substrate;
forming a tantalum layer on the free magnetic layer;
performing an annealing process on the tantalum layer; and
performing an oxidizing process on the tantalum layer after the annealing process.

15. The method of claim 14, wherein the free magnetic layer includes at least one magnetic element, and
wherein a boride-formation energy of the tantalum layer is lower than a boride-formation energy of the at least one magnetic element of the free magnetic layer.

16. The method of claim 14, wherein boron atoms included in the free magnetic layer diffuse into a lower portion of the tantalum layer by the annealing process to form a tantalum boride layer.

17. The method of claim 16, wherein a boron concentration of the tantalum boride layer is higher than a boron concentration of the free magnetic layer.

18. The method of claim 16, wherein a remaining upper portion of the tantalum layer is oxidized by the oxidizing process to form a tantalum oxide layer.

19. A method of manufacturing a memory device, the method comprising:
sequentially forming a reference magnetic layer, a tunnel barrier layer, and a free magnetic layer on a substrate;
forming a tantalum boride layer on the free magnetic layer; and
forming a metal oxide layer on the tantalum boride layer.

20. The method of claim 19, further comprising:
performing a thermal treatment process to diffuse oxygen atoms included in the metal oxide layer to an interface between the tantalum boride layer and the free magnetic layer.

* * * * *